United States Patent [19]

Shou et al.

[11] Patent Number: 5,490,099
[45] Date of Patent: Feb. 6, 1996

[54] METHOD OF MULTIPLYING AN ANALOG VALUE BY A DIGITAL VALUE

[75] Inventors: Guoliang Shou; Weikang Yang; Sunao Takatori; Makoto Yamamoto, all of Tokyo, Japan

[73] Assignees: Yozan Inc.; Sharp Corporation, both of Tokyo, Japan

[21] Appl. No.: 304,475

[22] Filed: Sep. 12, 1994

Related U.S. Application Data

[62] Division of Ser. No. 170,131, Dec. 21, 1993, Pat. No. 5,381,352.

[30] Foreign Application Priority Data

Dec. 22, 1992 [JP] Japan ................................. 4-357672

[51] Int. Cl.⁶ ..................................................... G06J 1/00
[52] U.S. Cl. ............................................................ 364/606
[58] Field of Search .................................. 364/606, 807, 364/715.08

[56] References Cited

U.S. PATENT DOCUMENTS

| | | | |
|---|---|---|---|
| 4,422,155 | 12/1983 | Amir et al. ............................... | 364/606 |
| 4,458,324 | 7/1984 | Burke et al. ............................. | 364/606 |
| 4,464,726 | 8/1984 | Chiang .................................... | 364/606 |
| 4,470,126 | 9/1984 | Hague ..................................... | 364/606 |
| 4,475,170 | 10/1984 | Hague .................................... | 364/606 |
| 4,890,251 | 12/1989 | Nitta et al. ......................... | 364/715.08 |
| 4,908,788 | 3/1990 | Fujiyama ........................... | 364/715.08 |

OTHER PUBLICATIONS

IWA, "The Beginning of Logical Circuit", The Electrical Engineering Handbook, 1980, pp. 144–146.

Miyazaki, "The Analog Usage Handbook", CQ Suppan Kabushikigaisha, 1992, pp. 139–140.

"The Electrical Engineering Handbook", Richard C. Dorf, Editor-in-Chief, 1993, pp. 1861–1865.

*Primary Examiner*—Tan V. Mai
*Attorney, Agent, or Firm*—Cushman, Darby & Cushman

[57] ABSTRACT

A method for directly multiplying an analog and a digital data without converting from analog-to-digital or digital-to-analog. An analog input voltage is provided to a plurality of switches. A digital input voltage including bits $b_0$ to $b_7$ which are provided as control signals to the switches. The switch output is integrated giving weights by means of a capacitive coupling, and a sign bit is added by a capacitive coupling CP with a double weight of the most significant bit ("MSB") of the digital input.

1 Claim, 3 Drawing Sheets

METHOD OF MULTIPLYING AN ANALOG VALUE BY A DIGITAL VALUE

This is a division of application No. 08/170,731, filed Dec. 21, 1993, U.S. Pat. No. 5,381,352.

FIELD OF THE INVENTION

The present invention relates to a multiplication circuit.

FIELD OF THE INVENTION

The present invention relates to a multiplication circuit.

BACKGROUND OF THE INVENTION

In recent years, there are arguments about a limitation of a digital computer because of expotential increase in the amount of money for investments for equipment concerning to a minute processing technology. Here, an analog computer is calling attention. On the other hand, stored conventional digital technology should be used and both workings of a digital and an analog processings are necessary, and operational processing system including an analog data and a digital data is important, However, conventionally, such an operational circuit including both an analog and a digital data without analog/digital or digital/analog converting is not known,

SUMMARY OF THE INVENTION

The present invention is invented so as to solve the conventional problems and has a purpose to provide a multiplication circuit capable of directly multiplying an analog data and a digital data without analog/digital or digital/analog converting.

A multiplication circuit according to the present invention controls an analog input voltage by a switching signal of a digital voltage so as to generate an analog output or cut-off the output. A digital input signal of a plural number of bits with giving weights by means of a capacitive coupling, and a sign bit is added by a capacitive coupling with a double of the MSB of the digital input.

PREFERRED EMBODIMENT OF THE INVENTION

Hereinafter, an embodiment of a multiplication circuit according to the present invention is described with referring to the attached drawings.

Figure 1:
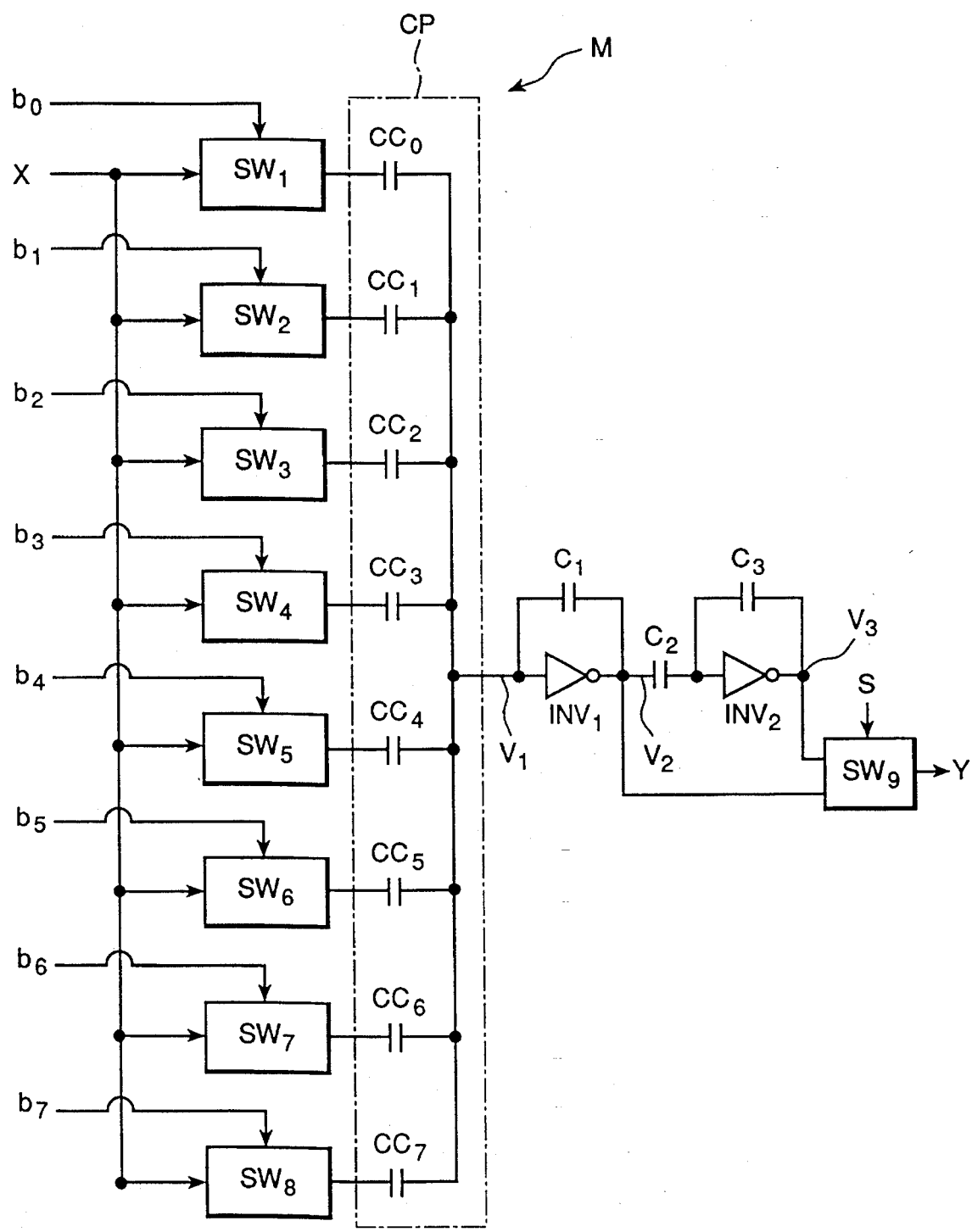
FIG. 1 is a circuit showing the first embodiment of a multiplication circuit according to the present invention.

In FIG. 1, a multiplication circuit M has a plural number of switching circuits from $SW_1$ to $SW_8$ connected with an analog input voltage X and digital input voltages from $b_0$ to $b_7$ corresponding to each bit of a digital data as a control signal to these switching circuits. Outputs of switching circuits are connected with each capacitor in a capacitor coupling CP parallelly connecting a plural number of capacitors from $CC_0$ to $CC_7$, and an output of CP gene rates an output as shown by following formula.

$$V_3 = -V_2(C_3/C_2) = X(C_3/C_2) \tag{11}$$

This formula is rewritten as follows under a condition of $C_2 = C_3$.

$$Y = X \tag{12}$$

As mentioned above, products of an analog input voltage X and a digital input voltage (from $b_0$ to $b_7$) are directly calculated in a multiplication circuit M and it is possible to perform inverted processing corresponding to sign bit s at $INV_1$.

Outputs of $INV_1$ and $INV_2$ are connected with a switching circuit $SW_9$, and $SW_9$ is switched by a sign bit s of a digital data. The switch $SW_9$ outputs $V_2$ or $V_3$ alternatively, as an output voltage Y. An inverted output $V_2$ of Y is output when a sign bit s is equal to 1 (high level), and a non-inverted output $V_2$ is output when a sign bits is equal to 0 (low level).

Figure 2:
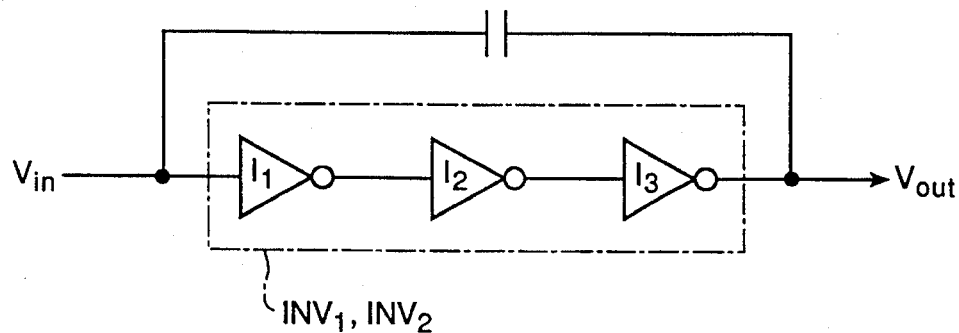
FIG. 2 is a detailed diagram showing inverter circuits $INV_1$ and $INV_2$.
Figure 3:
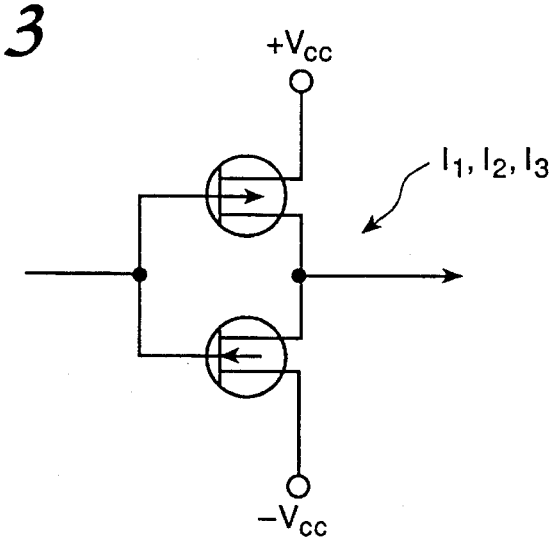
FIG. 3 is an inverter circuit in FIG. 2.

FIG. 2 shows the inside of composition of inverter circuits $INV_1$ and $INV_2$, and FIG. 3 shows an inverter circuit in FIG. 2.

As FIG. 2 shows, by serially connecting a plural number of inverters from $I_1$ to $I_3$, an output accuracy becomes higher. Inverters front $I_1$ to $I_3$ consist of nMOS and pMOS, the drains of pMOS is connected with a positive voltage, the source of pMOS is connected with the drain of nMOS, and the source of nMOS is connected with a negative voltage. An input voltage is input to the gates of nMOS and pMOS. An output is generated from the junctive of both MOSs.

Figure 4:
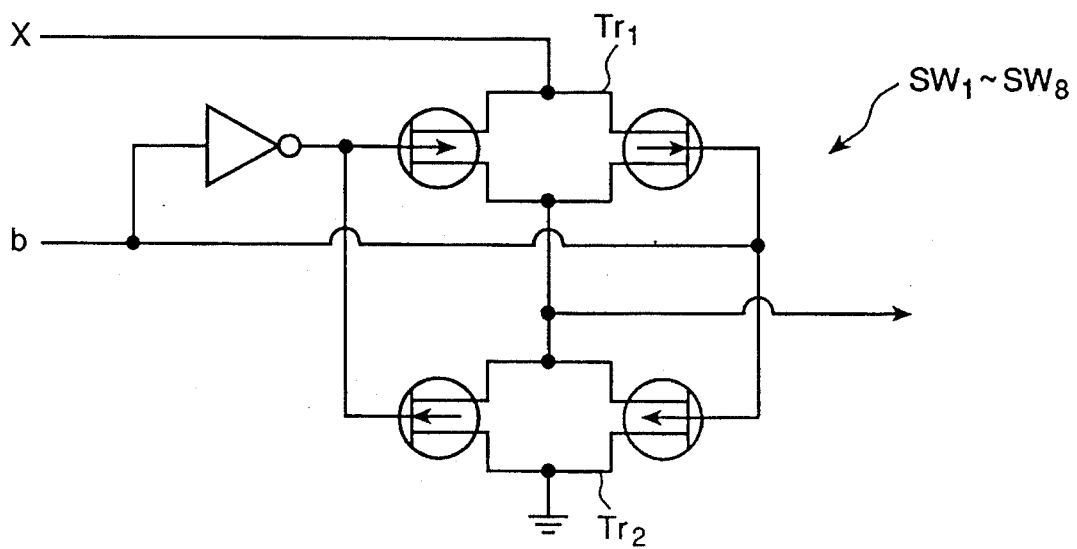
FIG. 4 is a circuit detailedly showing switching circuits from $SW_1$ to $SW_8$.

FIG. 4 shows the switching circuits from $SW_1$ to $SW_8$ in detail. The switching circuit is a CMOS switch consisting of a CMOS $Tr_1$ and a dummy transistor $TF_2$. An output voltage X is input to a drain of $Tr_1$, and an output is gene rated at the junctive of $Tr_1$ and $TF_2$. A digital input voltage is invertedly connected to the gate of pMOS of $Tr_1$ and the gate of nMOS of $Tr_2$ and non-invertedly connected to the gate of nMOS of $Tr_1$ and the gate of pMOS of $Tr_2$. As a result, it is possible to realize opening and closing of an analog input voltage with little voltage drop at a switch.

Figure 5:
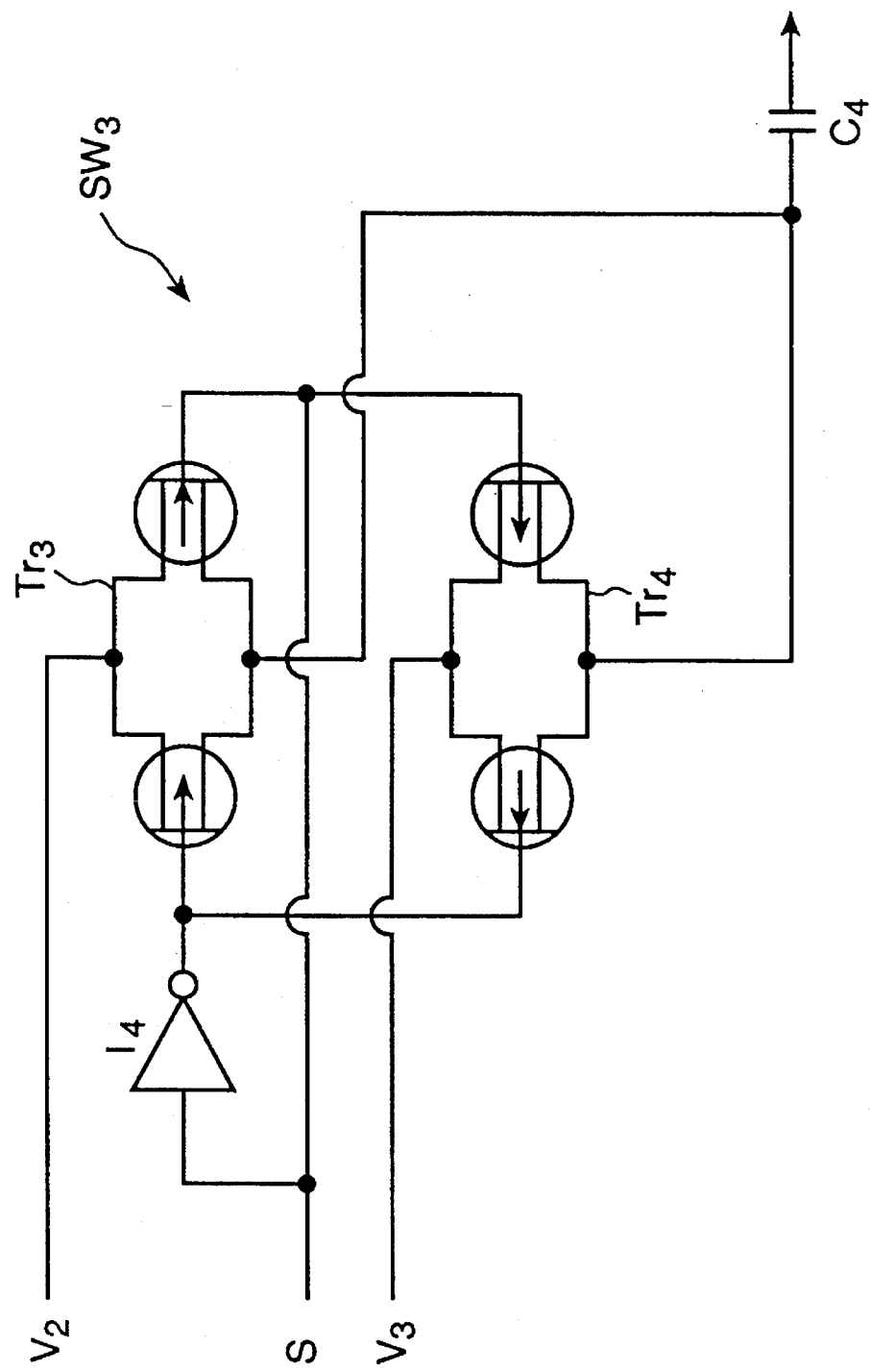
FIG. 5 is a circuit diagram showing the inside of a switching circuit $SW_9$.

FIG. 5 shows the switching circuit in detail. $V_2$ and $V_3$ are connected with a pMOS source side in two CMOSs $Tr_3$ and $Tr_4$, and pMOS drain side is connected with a common capacitance $C_4$. Sign bit s is directly input to a nMOS gate of $Tr_3$ and pMOS gate of $Tr_4$, and an signal inverted by an inverter $I_4$ is input to a gate of pMOS of $Tr_3$ and a gate of nMOS of $Tr_4$. When a sign bit s is equal to 1, then $Tr_3$ becomes conductive and an inverted output $V_2$ is impressed to $C_4$, When a sign bit s is equal to 0, then $Tr_4$ is conductive so that non-inverted output $V_3$ is impressed to $G_4$. Therefore, it is possible to generate positive and negative output corresponding to a sign bit.

As mentioned above, a multiplication circuit according to the present invention controls an analog input voltage by a switching signal of a digital voltage so as to generate an analog output or cut-off the outputs. A digital input signal of a plural number of bits is integrated giving weights by means of a capacitive coupling, and a sign bit is added by a capacitive coupling with a double weight of the MSB of the digital input so that it is possible to provide a multiplication circuit directly multiplying an analog and a digital data without converting analog/digital or digital/analog converting.

What is claimed is:

1. A method of directly multiplying a digital value by an analog value, comprising the steps of:
    coupling the analog value in parallel to a plurality of switching elements, each switching element providing an output to one of a corresponding plurality of weighted capacitances, each of said weighted capacitances providing an output to a common node such that an integrated signal is generated;

coupling bits of the digital value to said switching elements such that each switching element is controlled by a respective bit of said digital signal; and selectively inverting said integrated signal, said step of selectively inverting including a first step of inverting said integrated signal to generate an inverted integrated signal, a second step of inverting said inverted integrated signal to generate a twice-inverted integrated signal, and a third step of selectively providing either said inverted integrated signal or said twice-inverted integrated signal as an output, depending upon a state of a sign bit of the digital value.

* * * * *